US010670650B2

(12) United States Patent
Wolff

(10) Patent No.: US 10,670,650 B2
(45) Date of Patent: Jun. 2, 2020

(54) DEVICE TESTING WITH HEAT PIPE COOLING ASSEMBLY

(71) Applicant: Advantest Corporation, Tokyo (JP)

(72) Inventor: Roland Wolff, Santa Rosa, CA (US)

(73) Assignee: ADVANTEST CORPORATION, Tokyo (JP)

( * ) Notice: Subject to any disclaimer, the term of this patent is extended or adjusted under 35 U.S.C. 154(b) by 281 days.

(21) Appl. No.: 15/718,895

(22) Filed: Sep. 28, 2017

(65) Prior Publication Data

US 2019/0094295 A1    Mar. 28, 2019

(51) Int. Cl.
| G01R 31/28 | (2006.01) |
|---|---|
| H01L 23/427 | (2006.01) |
| H05K 7/20 | (2006.01) |
| F28D 15/02 | (2006.01) |
| H01L 23/367 | (2006.01) |

(52) U.S. Cl.
CPC ..... *G01R 31/2874* (2013.01); *F28D 15/0233* (2013.01); *F28D 15/0266* (2013.01); *F28D 15/0275* (2013.01); *G01R 31/2877* (2013.01); *H01L 23/427* (2013.01); *H05K 7/20336* (2013.01); *H05K 7/20418* (2013.01); *H05K 7/20736* (2013.01); *H05K 7/20836* (2013.01); *H01L 23/3672* (2013.01)

(58) Field of Classification Search
CPC ............. G01R 1/07378; G01R 31/003; G01R 31/2874
See application file for complete search history.

(56) References Cited

U.S. PATENT DOCUMENTS

| 6,796,372 B2 | 9/2004 | Bear |
|---|---|---|
| 6,988,157 B2 | 1/2006 | Lecourtier |
| 7,281,076 B2 | 10/2007 | Yates et al. |
| 7,751,188 B1 * | 7/2010 | French ............... H05K 7/20736 165/104.33 |
| 7,774,073 B2 | 8/2010 | Cane et al. |
| 2004/0130868 A1 | 7/2004 | Schwartz et al. |
| 2008/0024992 A1 | 1/2008 | Pflueger |
| 2009/0183866 A1 * | 7/2009 | Sakaue ............... G05D 23/1904 165/287 |
| 2010/0319883 A1 | 12/2010 | Facusse |
| 2013/0340977 A1 | 12/2013 | Singleton |
| 2014/0195859 A1 | 7/2014 | Dickenson et al. |

OTHER PUBLICATIONS

Technical Data Sheet HP-1 Heat Pipe, Thermacore, Jul. 2012, pp. 1-2.

* cited by examiner

*Primary Examiner* — Tung X Nguyen

(57) ABSTRACT

New cooling assembly suitable for use in the testing of devices is disclosed. The new cooling assembly transfers heat that is in close proximity to, within vicinity of, and/or in surrounding area adjacent to a DUT (device under test) undergoing testing to a target location that is away from the DUT. Consequently, the DUT is cooled. By employing heat pipes coupled to plates in contact with the DUT, the new cooling assembly augments cooling capacity at the DUT's location and surrounding area. Yet, the use of an ambient air flow generated by a fan is sufficient to manage and dissipate the heat transferred to the target location. Also, the new cooling assembly is readily installable in DUT testing equipment because its design is quite flexible to adapt to various requirements and space constraints of DUT testing equipment for different DUT footprints or form factors.

20 Claims, 5 Drawing Sheets

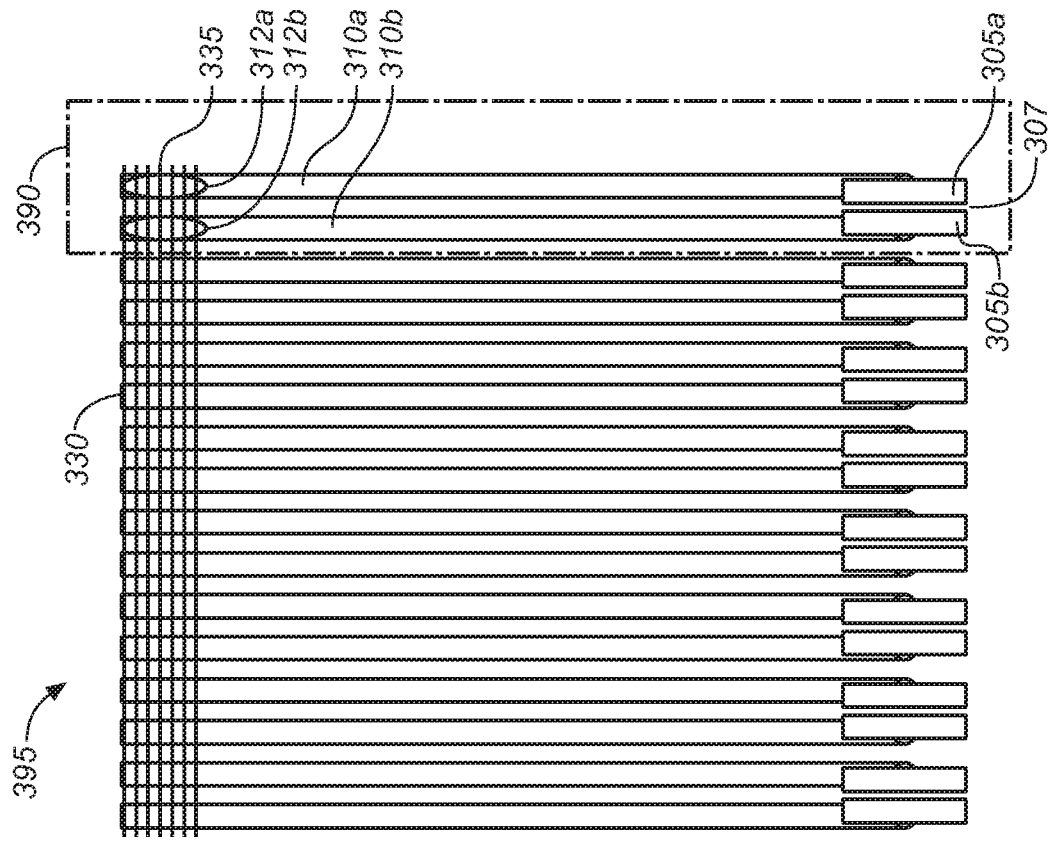
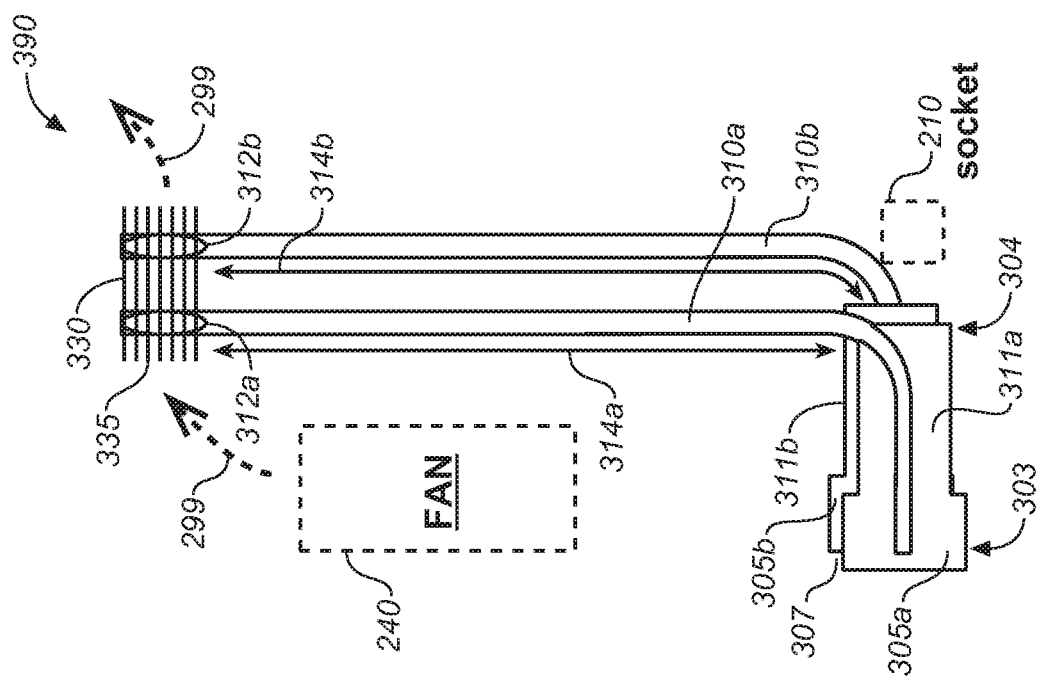
FIG. 3
FIG. 2

DEVICE TESTING WITH HEAT PIPE COOLING ASSEMBLY

FIELD

Embodiments of the present invention relate to testing of devices. More specifically, embodiments relate to cooling assemblies and equipment suitable for use in the testing of devices, e.g., electronic devices.

BACKGROUND

The use of environmental testing chambers is prevalent in the testing of electronic devices. The environmental testing chamber provides controlled environmental conditions by utilizing various mechanisms to cool and/or to heat the air inside of the environmental testing chamber. However, some types of electronic devices do not require the testing to be performed under the tightly controlled environmental conditions offered by the environmental testing chamber. Generally, DUTs (devices under test) are placed inside the environmental testing chamber while test equipment is positioned outside the environmental testing chamber. This causes problems in that the DUTs can't be manipulated during testing because they are within the environmental testing chamber and are not readily available for physical access. Also, the use of the environmental testing chamber is very expensive. Further, while the testing is going on, there is no way to add DUTs or remove DUTs because the entire lot typically needs to be tested at the same time inside the environmental testing chamber. Therefore, use of the expensive environmental testing chamber is not advantageous.

During the testing of electronic devices, heat is generated and emitted to the surrounding environment by the electronic devices. Managing this heat is a challenging task during the testing of the electronic devices. Numerous cooling mechanisms exist to dissipate the heat and to cool the electronic devices. There is a wide cost range for these cooling mechanisms. Each cooling mechanism has its advantages and deficiencies.

Heat warms and raises the temperature of the electronic device during testing. Cooling mechanisms are used to regulate the temperature of the electronic device at a desired temperature or desired temperature range during testing.

Factors that influence the effectiveness of a cooling mechanism include cooling capacity and cooling control of the cooling mechanism. Cooling capacity generally refers to an amount of heat the cooling mechanism is able to dissipate from a volume or an area within a time interval. Cooling control generally refers to aspects of manipulating the operation of the cooling mechanism to address current environmental conditions. As the manufacturing phase of electronic devices matures to volume production, the testing phase is pressured to adopt new techniques for cooling and for cooling control that are better suited for performing volume testing of electronic devices and that conform to testing specifications of designers and manufacturers.

SUMMARY

New cooling assembly suitable for use in the testing of devices is disclosed. The new cooling assembly transfers heat that is in close proximity to, within vicinity of, and/or in surrounding area adjacent to a DUT (device under test) undergoing testing to a target location that is away from the DUT. Consequently, the DUT is cooled. At the target location, heat and temperature have less influence on the DUT. Accordingly, there is more flexibility as to the manner of dissipating the heat and as to a time period for accomplishing the heat dissipation at the target location. Further, the new cooling assembly is well suited for cooling applications during testing of different types of devices (or DUTs) including, but not limited to, network cards, graphics cards, chips, microprocessors, hard disk drives (HDD), and solid state drives (SSD).

By employing heat pipes coupled to plates in contact with the DUT, the new cooling assembly augments cooling capacity at the DUT's location and surrounding area to handle the DUT with excessive heat emission, the DUT with heat emission from a reduced-size footprint or form factor (e.g., M.2), and/or the DUT with other heat emission properties and/or form factors. Yet, the use of an ambient air flow generated by a fan is sufficient to dissipate the heat transferred by the new cooling assembly to the target location although the use of the ambient air flow generated by the fan may be inadequate for cooling at the DUT's location and surrounding area. It is possible to increase cooling capacity with the new cooling assembly at the DUT's location and surrounding area by a multiple digit factor, such as 100, relative to cooling capacity of subjecting the DUT's location and surrounding area to the ambient air flow generated just by the fan.

Also, the new cooling assembly is readily installable in DUT testing equipment because its design is quite flexible to adapt to various requirements and space constraints of DUT testing equipment for different DUT footprints or form factors (e.g., M.2, U.2, SATA 2.5", mSATA, etc.). Moreover, the new cooling assembly is well suited for performing volume testing of DUTs and is compatible with automated robotic handling of the DUTs. Furthermore, the new cooling assembly eliminates the need for environmental testing chambers.

In one embodiment, a cooling apparatus comprises a first plate, a second plate, a first heat pipe, a second heat pipe, and a heat sink. The first plate is operable to contact a first side of a DUT (device under test). The second plate is operable to contact a second side of the DUT. Moreover, the second plate is further disposed opposite and spaced from the first plate to receive the DUT therebetween. The first heat pipe is coupled to the first plate, and the second heat pipe is coupled to the second plate. In addition, the heat sink is disposed a length from the first and second plates and is coupled to at least one of the first or second heat pipes. The heat sink further includes a plurality of fins.

In another embodiment, a cooling apparatus comprises first and second plates, first and second heat pipes, and a heat sink. The first plate is operable to contact a first side of a DUT (device under test). The second plate is operable to contact a second side of the DUT. Also, the second plate is disposed opposite and spaced from the first plate to receive the DUT therebetween. Continuing, the first heat pipe includes a first evaporation region disposed in the first plate and a first condensation region separated by a first length from the first evaporation region. Moreover, the second heat pipe includes a second evaporation region disposed in the second plate and a second condensation region separated by a second length from the second evaporation region. In addition, the heat sink is coupled to at least one of the first or second condensation regions. The heat sink further includes a plurality of fins.

In yet another embodiment, a testing apparatus comprises a test execution module operable to test a DUT (device under test) and a DUT interface board (DIB) operable to communicate test information between the DUT and the test execution module. Moreover, the DIB includes a housing, a loadboard, a first plate, a second plate, a first heat pipe, a second heat pipe, and a heat sink. The loadboard includes a socket operable to receive and couple to the DUT. Continuing, the first plate is operable to contact a first side of the DUT. The second plate is operable to contact a second side of the DUT. Also, the second plate is disposed opposite and spaced from the first plate to receive the DUT therebetween. The socket is disposed adjacent to the first and second plates. Further, the first heat pipe is coupled to the first plate, and the second heat pipe is coupled to the second plate. In addition, the heat sink is disposed a length from the first and second plates and is coupled to at least one of the first or second heat pipes. The heat sink further includes a plurality of fins.

BRIEF DESCRIPTION OF THE DRAWINGS

The accompanying drawings, which are incorporated in and form a part of this specification, illustrate embodiments, together with the description, serve to explain the principles of the disclosure.

FIG. 2 shows a right side view of a heat pipe cooling assembly in accordance with an embodiment, showing the heat pipe cooling assembly not installed in a cooling application.

FIG. 3 illustrates a front elevation view of a heat pipe cooling assembly in accordance with an embodiment, showing the heat pipe cooling assembly not installed in a cooling application.

DETAILED DESCRIPTION

Figure 1:
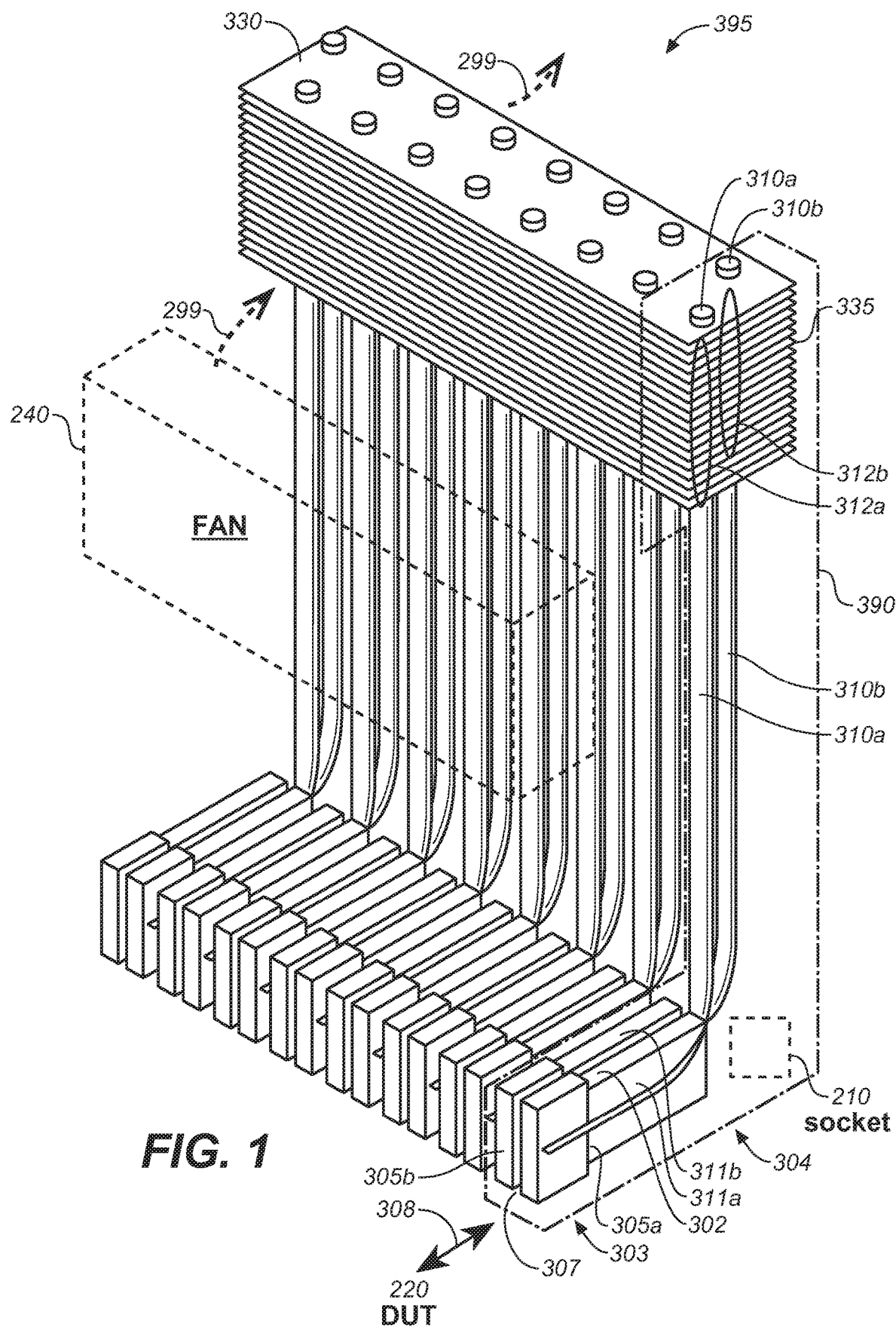
FIG. 1 depicts a perspective view of a heat pipe cooling assembly in accordance with an embodiment, showing the heat pipe cooling assembly not installed in a cooling application.

Reference will now be made in detail to embodiments, examples of which are illustrated in the accompanying drawings. While the disclosure will be described in conjunction with these embodiments, it should be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description, numerous specific details are set forth in order to provide a thorough understanding. However, it will be recognized by one of ordinary skill in the art that embodiments may be practiced without these specific details.

New cooling assembly suitable for use in the testing of devices is disclosed. The new cooling assembly transfers heat that is in close proximity to, within vicinity of, and/or in surrounding area adjacent to a DUT (device under test) undergoing testing to a target location that is away from the DUT. Consequently, the DUT is cooled. By employing heat pipes coupled to plates in contact with the DUT, the new cooling assembly augments the cooling capacity at the DUT's location and surrounding area to handle the DUT with excessive heat emission, the DUT with heat emission from a reduced-size footprint or form factor (e.g., M.2), and/or the DUT with other heat emission properties and/or form factors. Yet, the use of an ambient air flow generated by a fan is sufficient to manage and dissipate the heat transferred by the new cooling assembly to the target location although the use of the ambient air flow generated by the fan may be inadequate for cooling at the DUT's location and surrounding area. It is possible to increase cooling capacity with the new cooling assembly at the DUT's location and surrounding area by a multiple digit factor, such as 100, relative to cooling capacity of subjecting the DUT's location and surrounding area to the ambient air flow generated just by the fan.

At the target location, heat and temperature have less influence on the DUT. Accordingly, there is more flexibility as to the manner of dissipating the heat and as to a time period for accomplishing the heat dissipation at the target location. Further, the new cooling assembly is well suited for cooling applications during testing of different types of devices (or DUTs) including, but not limited to, network cards, graphics cards, chips, microprocessors, hard disk drives (HDD), and solid state drives (SSD).

Also, the new cooling assembly is readily installable in DUT testing equipment (FIGS. 4, 5, and 6) because its design is quite flexible to adapt to various requirements and space constraints of DUT testing equipment (FIGS. 4, 5, and 6) for different DUT footprints or form factors (e.g., M.2, U.2, SATA 2.5", mSATA, etc.). For DUT testing equipment (FIGS. 4, 5, and 6) that relies on cooling by subjecting the DUT's location and surrounding area to the ambient air flow generated by the fan, the installation of the new cooling assembly sufficiently expands cooling capacity to adequately cool challenging heat emission properties, such as the heat emission properties of DUTs with reduced-size footprint or form factor (e.g., M.2), which would not be possible in the absence of the new cooling assembly. Moreover, the new cooling assembly is well suited for performing volume testing of DUTs and is compatible with automated robotic handling of the DUTs. Furthermore, the new cooling assembly eliminates the need for environmental testing chambers.

The following discussion will focus on an embodiment of a heat pipe cooling assembly depicted as not installed in a cooling application in FIGS. 1, 2, and 3. For cooling applications, the heat pipe cooling assembly may be installed in a DUT testing module to cool the DUT during performance of testing. Thereafter, a detailed description of an exemplary DUT testing module that may employ the heat pipe cooling assembly of FIGS. 1, 2, and 3 in accordance with an embodiment will be provided in connection with FIGS. 4 and 5. Finally, an embodiment of a heat pipe cooling assembly installed in a DIB (DUT interface board) of a DUT testing module will be described with reference to FIG. 6.

FIG. 1 depicts a perspective view of a heat pipe cooling assembly 390 in accordance with an embodiment, showing the heat pipe cooling assembly 390 not installed in a cooling application. More specifically, an assembly 395 comprising multiple heat pipe cooling assemblies 390 is pictured in FIG. 1. Eight heat pipe cooling assemblies 390 are integrated and arranged in a row to build and form the assembly 395. Depending on a cooling application in which installed, the assembly 395 may have less than or greater than eight heat pipe cooling assemblies 390. It should be understood that the heat pipe cooling assembly 390 and the assembly 395 are not limited to the illustration of FIG. 1.

Figure 4:
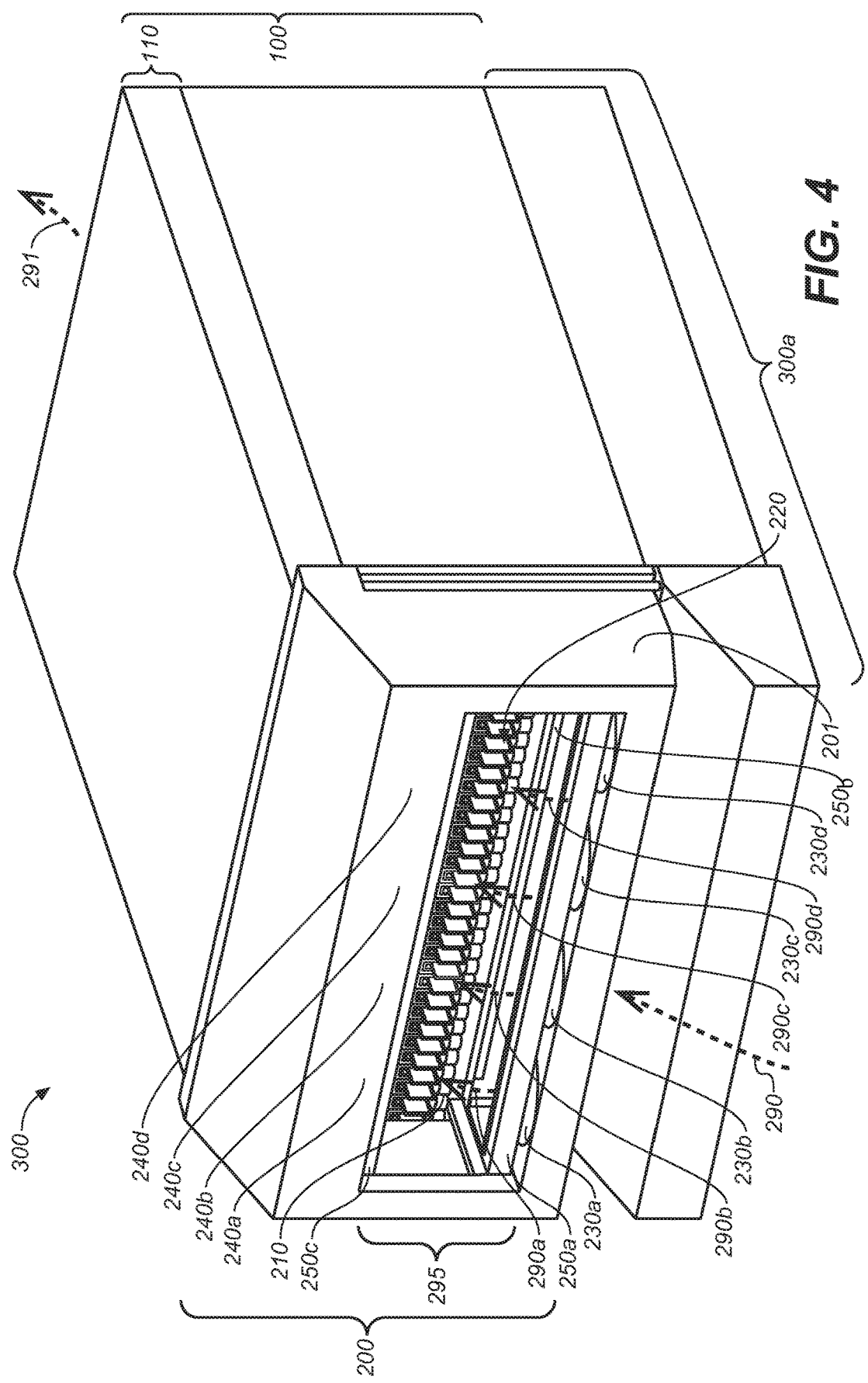
FIG. 4 depicts a perspective view of an exemplary DUT (device under test) testing module that may utilize a heat pipe cooling assembly in accordance with an embodiment.
Figure 5:
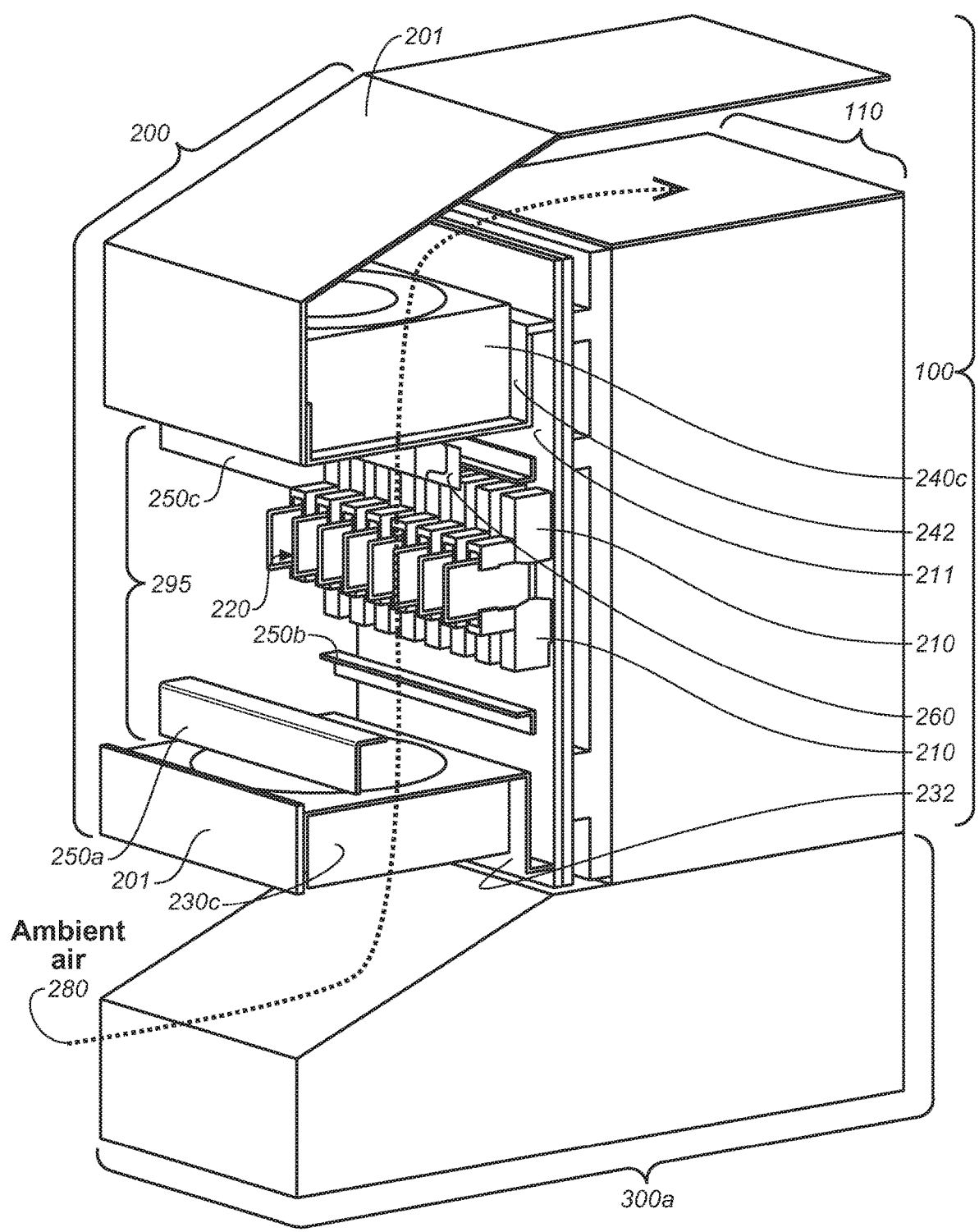
FIG. 5 shows a cutaway view of the exemplary DUT testing module of FIG. 4 in accordance with an embodiment.

As will be explained later, for cooling applications, the heat pipe cooling assembly 390 (and assembly 395) may be installed in a DUT testing module to cool the DUT during performance of testing. Detailed description of an exemplary DUT testing module 300 is provided in connection with FIGS. 4 and 5. The exemplary DUT testing module 300 (FIGS. 4 and 5) may be modular and may be capable of being inserted into a rack slot of a rack of customizable columns and rows. Continuing, the exemplary DUT testing module 300 (FIGS. 4 and 5) may be operable to perform testing on a DUT 220 or a group of DUTs 220 (FIGS. 4 and 5) by communicating power, instructions, signals, data, test results, and/or information with the DUT 220 or DUTs 220 (FIGS. 4 and 5). In addition, the exemplary DUT testing module 300 (FIGS. 4 and 5) may include processing, communication, and storage circuitry to conduct the test on the DUT 220 or DUTs 220 (FIGS. 4 and 5).

Although the DUT testing module 300 in which the heat pipe cooling assembly 390 may be installed and the DUT 220 are not shown in FIGS. 1, 2, and 3, reference will be made to FIGS. 4, 5, and 6 to describe the positioning and arrangement of the heat pipe cooling assembly 390 relative to the DUT 220, the DUT testing module 300, and parts of the DUT testing module 300.

As depicted in FIG. 1, the heat pipe cooling assembly 390 includes a right plate 305a, a left plate 305b, a right heat pipe 310a, a left heat pipe 310b, and a heat sink (or heat radiator) 330. The different views illustrated in FIGS. 1, 2, and 3 provide position and arrangement details of each part relative to the other parts of the heat pipe cooling assembly 390. Although FIG. 1 shows the heat sink 330 shared by the eight heat pipe cooling assemblies 390, it should be understood that the eight heat pipe cooling assemblies 390 may have separate heat sinks instead of the singular heat sink 330 that is shared.

The right and left plates 305a and 305b are configured in a vertical orientation to contact sides (bottom and top) of the DUT 220 (FIG. 6) vertically aligned with the right and left plates 305a and 305b. As seen in FIGS. 1-3, the left plate 305b is opposite and spaced apart from the right plate 305a, creating a gap 307 between the right plate 305a and the left plate 305b. The right plate 305a and the left plate 305b have a front 303 and a rear 304, as illustrated in FIGS. 1 and 2. In an embodiment, the right and left plates 305a and 305b are oriented parallel to each other.

Figure 6:
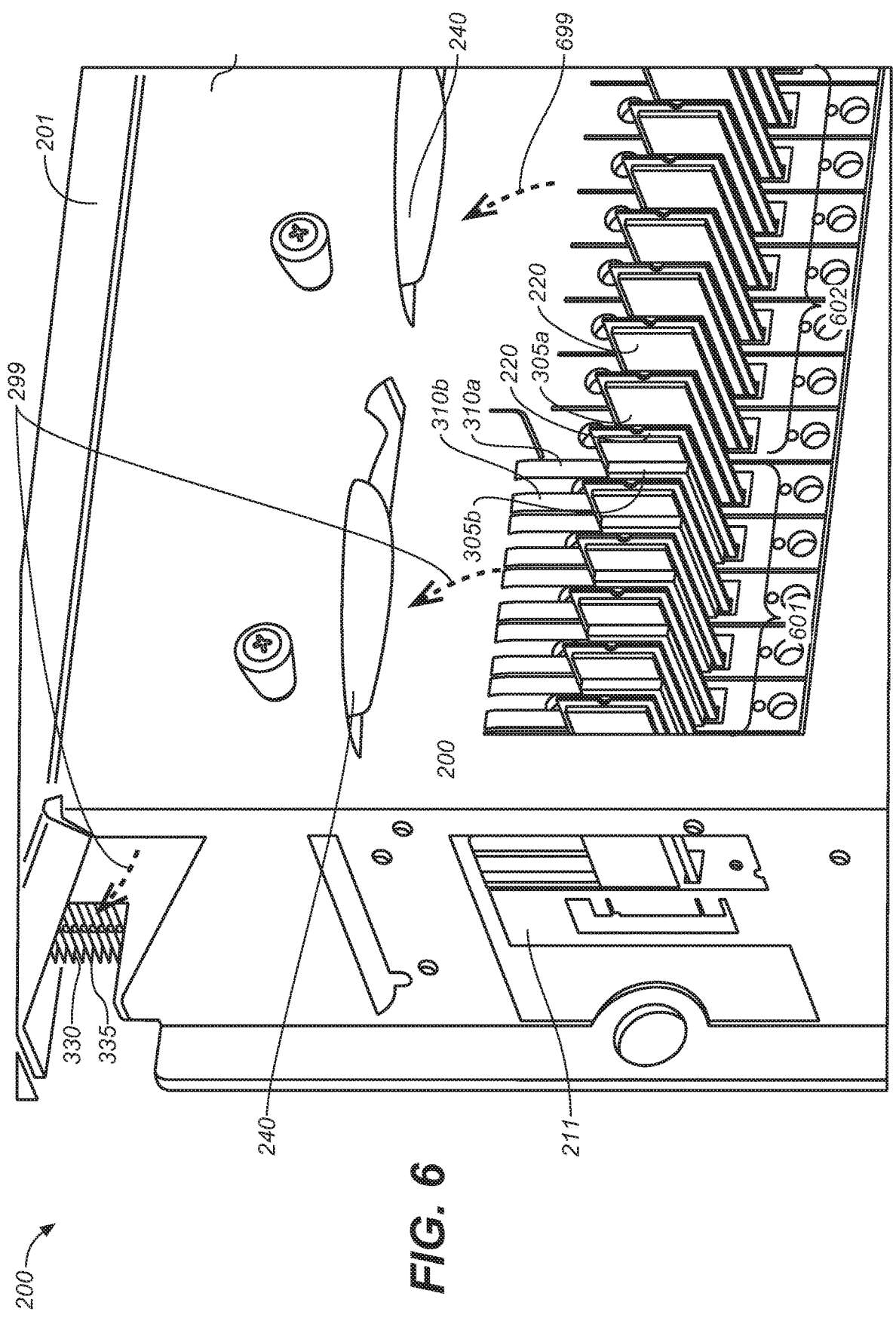
FIG. 6 illustrates a DIB (DUT interface board) of a DUT testing module in accordance with an embodiment, showing a heat pipe cooling assembly installed in the DIB.

In cases where the heat pipe cooling assembly 390 is installed in the DUT testing module 300 (FIGS. 4, 5, and 6), FIGS. 1 and 2 depict positioning and arrangement of the right and left plates 305a and 305b relative to a socket (or connector) 210 of the DUT testing module 300 (FIGS. 4, 5, and 6), where the socket 210 receives and secures the DUT 220 for testing by the DUT testing module 300 (FIGS. 4, 5, and 6). The socket 210 is shown in broken line to distinguish it from the heat pipe cooling assembly 390 and the assembly 395. As shown in FIGS. 1 and 2, the socket 210 is located adjacent to the rear 304 of the right and left plates 305a and 305b. Moreover, the arrow 308 indicates the direction the DUT 220 is inserted via the front 303 into the gap 307 between the right plate 305a and the left plate 305b to engage with the socket 210. Also, the arrow 308 points to the direction in which the DUT 220 is pulled out via the front 303 from the gap 307 between the right plate 305a and the left plate 305b to disengage from the socket 210. It should be understood that positioning and arrangement of the socket 210 are not limited to the illustrations of FIGS. 1 and 2.

In an embodiment, a composition of the right and left plates 305a and 305b includes a heat sink material to support thermal conduction from the DUT 220 to the right and left plates 305a and 305b during testing of the DUT 220, which releases heat due to the testing. The heat sink material may be metallic or may be non-metallic. Examples of metallic heat sink materials include copper, copper alloys, aluminum, and aluminum alloys.

Referring again to FIG. 1, a number of factors influence the size and shape of the right and left plates 305a and 305b. The right and left plates 305a and 305b may be designed to make contact with the sides (bottom and top) of the DUT 220. For favorable thermal conduction from the DUT 220 to the right plate 305a and the left plate 305b, an objective of shape of the right and left plates 305a and 305b is to increase the available surface area of the right and left plates 305a and 305b in contact with the sides (bottom and top) of the DUT 220. Also, thermal conduction of the right and left plates 305a and 305b rises with an increase in thickness 302 and/or size, where thickness 302 is a horizontally oriented dimension of the right and left plates 305a and 305b. For spacing to support automated robotic handling of the DUTs 220, the thickness 302 and size of the right and left plates 305a and 305b are maintained above specific thresholds. For pitch between DUTs 220 for concurrent testing, an objective of the thickness 302 of the right and left plates 305a and 305b is to increase the number of DUTs 220 concurrently tested by constraining or reducing the thickness 302 to decrease the pitch between DUTs 220. In an embodiment, the right and left plates 305a and 305b are rectangular in shape.

In an embodiment, the right and left plates 305a and 305b are movably coupled. Any of various mechanisms (not shown) may be implemented to permit movement of the right and left plates 305a and 305b relative to each other to allow insertion of the DUT 220 into and to allow removal of the DUT 220 from the gap 307 between the right plate 305a and the left plate 305b. Also, the mechanism (not shown) may facilitate operation of the right and left plates 305a and 305b in a clamp position to firmly secure the DUT 220 therebetween during testing and in a release position to permit movement of the DUT 220 into and out of the gap 307 between the right plate 305a and the left plate 305b. In the clamp position, the right and left plates 305a and 305b may be in contact with the sides (bottom and top) of the DUT 220 due to pressure or tension from the mechanism (not shown). For example, the mechanism (not shown) may include a tension spring. When the pressure or tension is released, the right and left plates 305a and 305b separate from the sides of the DUT 220 and move to the release position, enabling the insertion and removal of the DUT 220. For example, the pressure or tension may be released and/or set via a rotatable notch of the mechanism (not shown).

Continuing with FIG. 1, the right plate 305a is coupled to the right heat pipe 310a to transfer heat away from the right plate 305a. Similarly, the left plate 305b is coupled to the left heat pipe 310b to transfer heat away from the left plate 305b. The heat is generated by the DUT 220 during testing and is thermally conducted from the DUT 220 to the right plate 305a and from the DUT 220 to the left plate 305b.

In an embodiment, a portion (e.g., evaporation region 311a) of the right heat pipe 310a is integrated into, embedded into, or buried under a surface of the right plate 305a. This increases a surface area of the right heat pipe 310a in contact with the right plate 305a between the front 303 and the rear 304. For example, the portion (e.g., evaporation region 311a) of the right heat pipe 310a may be positioned entirely or may be positioned partially within the thickness 302 dimension of the right plate 305a. The right heat pipe 310a may be epoxied or soldered to the right plate 305a. Alternatively, the right plate 305a may be formed or created around the structure of the right heat pipe 310a. Further, the right heat pipe 310a protrudes from the rear 304 and extends upward and away from the right plate 305a, as depicted in FIGS. 1, 2, and 3.

Analogous to the right plate 305a and the right heat pipe 310a, a portion (e.g., evaporation region 311b) of the left heat pipe 310b is integrated into, embedded into, or buried under a surface of the left plate 305b. This also increases a surface area of the left heat pipe 310b in contact with the left plate 305b between the front 303 and the rear 304. For example, the portion (e.g., evaporation region 311b) of the left heat pipe 310b may be positioned entirely or may be positioned partially within the thickness 302 dimension of the left plate 305b. The left heat pipe 310b may be epoxied or soldered to the left plate 305b. Alternatively, the left plate 305b may be formed or created around the structure of the left heat pipe 310b. Further, the left heat pipe 310b protrudes from the rear 304 and extends upward and away from the left plate 305b, as depicted in FIGS. 1, 2, and 3.

Returning to FIG. 1, the right and left heat pipes 310a and 310b are tubular and are configured to efficiently and effectively transfer heat or thermal energy from a heat source to a target location, which is cooler than the heat source and is away from the heat source. The right and left heat pipes 310a and 310b each may include a vacuumed sealed tubular structure, a limited amount of vaporizable working fluid inside the structure, a wick-type medium, and vacuumed central space inside the structure. Additionally, the right and left heat pipes 310a and 310b each may include an evaporation region (or evaporator) 311a and 311b (FIGS. 1 and 2) and a condensation region (or condenser) 312a and 312b (FIGS. 1 and 2). For the right heat pipe 310a, the condensation region 312a, which is in contact with the heat sink 330, may be separated by the length 314a from the evaporation region 311a, which is in contact with the right plate 305a. For the left heat pipe 310b, the condensation region 312b, which is in contact with the heat sink 330, may be separated by the length 314b from the evaporation region 311b, which is in contact with the left plate 305b. The lengths 314a and 314b may be different or may be equivalent. Moreover, there are no mechanical moving parts in the right and left heat pipes 310a and 310b. It should be understood that the right and left heat pipes 310a and 310b are not limited to the illustrations of FIGS. 1 and 2.

Composition material, working fluid, wick-type medium, shape, length, and diameter of the right and left heat pipes 310a and 310b depend on various factors, including operational temperature range, thermal conductivity and capacity, and heat source location relative to the target location. While materials such as copper, aluminum, graphite, and diamond may have thermal conductivities ranging from 250 Watts/meter Kelvin (W/m K) to 1,500 W/m K, it is possible to design the right and left heat pipes 310a and 310b to have effective thermal conductivities between 5,000 W/m K and 200,000 W/m K. Effective thermal conductivity rises with increase in length and/or diameter. Examples of composition materials for the tubular structure include aluminum, copper, titanium, stainless steel, and tungsten. Examples of working fluids include water, acetone, nitrogen, methanol, ammonia, and liquid metal. Groove wick, screen/woven wick, and sintered powder wick are examples of the wick-type medium. Alternatively, the right and left heat pipes 310a and 310b may have planar shapes.

Now focusing on the right heat pipe 310a, its function will be described next. The evaporation region 311a is in contact with the right plate 305a, which is a heat source due to the heat generated by the DUT 220 during testing and thermally conducted to the right plate 305a. Initially, the evaporation region 311a absorbs heat from the right plate 305a. The absorbed heat causes a rise in temperature of the working fluid in the evaporation region 311a, leading to vaporization and phase change into vapor (or gas). Thereafter, inside the right heat pipe 310a, the vapor travels to the condensation region 312a, which is in contact with or coupled to the heat sink 330, which is the target location that is away from the DUT 220. Since the condensation region 312a and the heat sink 330 are cooler than the right plate 305a, the vapor in the condensation region 312a condensates and phase changes into the working fluid (or liquid), releasing heat to the heat sink 330, which then dissipates the heat transferred from the condensation region 312a. Inside the right heat pipe 310a, the working fluid returns to the evaporation region 311a via capillary action or gravity. This cycle repeats to continue the heat transfer from the right plate 305a to the heat sink 330 to dissipate the heat generated by the DUT 220 during testing. Further, the function of the left heat pipe 310b is analogous to that of the right heat pipe 310a.

As illustrated in FIGS. 1 and 2, the heat sink 330 is coupled to or is in contact with the condensation regions 312a and 312b of the right and left heat pipes 310a and 310b. Alternatively, the heat sink 330 may be coupled to or may be in contact with either the condensation region 312a or the condensation region 312b while another heat sink may be coupled to or may be in contact with the other condensation region. Moreover, the heat sink 330 is positioned a length above and away from the right and left plates 305a and 305b. Also, the heat sink 330 includes a plurality of fins 335. Although the fins 335 are depicted as rectangular fins, it should be understood the fins 335 may be pin fins. As already described, the right and left heat pipes 310a and 310b transfer heat from the right and left plates 305a and 305b to the heat sink 330, which is operable to dissipate the heat via the surfaces of its fins 335. It should be understood that the heat sink 330 is not limited to the illustrations of FIGS. 1 and 2.

In an embodiment, the heat sink 330 is subjected to an ambient air flow to cool the heat sink 330 and to dissipate the heat from the surfaces of its fins 335, where a fan draws the ambient air from a surrounding environment of the equipment for testing DUTs within a testing facility or building. The right and left heat pipes 310a and 310b may also be in the path of the ambient air flow to experience a cooling influence from the ambient air flow. In cases where the heat pipe cooling assembly 390 is installed in the DUT testing module 300 (FIGS. 4, 5, and 6), FIGS. 1 and 2 depict positioning and arrangement of the heat sink 330 and the right and left heat pipes 310a and 310b relative to a fan 240 of the DUT testing module 300 (FIGS. 4, 5, and 6) and to the ambient air flow 299 generated by the fan 240. The fan 240 and the ambient air flow 299 are shown in broken line to distinguish them from the heat pipe cooling assembly 390 and the assembly 395. As shown in FIGS. 1 and 2, the fan 240 is located above the right and left plates 305a and 305b, adjacent to the right and left heat pipes 310a and 310b, and below the heat sink 330. Moreover, the ambient air flow 299 generated by the fan 240 passes over the surfaces of the heat sink 330 and its fins 335 to provide a cooling effect and to dissipate the heat from the heat sink 330. Also, the ambient air flow 299 generated by the fan 240 passes over the surfaces of the right and left heat pipes 310a and 310b to provide the cooling effect. Alternatively, more than one fan may generate the ambient air flow. It should be understood that positioning and arrangement of the fan 240 and the ambient air flow 299 are not limited to the illustrations of FIGS. 1 and 2.

Although the ambient air flow 299 generated by the fan 240 may be inadequate by itself for cooling the DUT and its surrounding area during testing, the ambient air flow 299 generated by the fan 240 is sufficient to manage and dissipate the heat transferred to the heat sink 330. It is possible for the heat pipe cooling assembly 390 to increase heat dissipation of the heat generated by the DUT during testing by a factor of 100 or more relative to the heat dissipated by using the ambient air flow 299 by itself for cooling the DUT and its surrounding area during testing.

Furthermore, the heat pipe cooling assembly 390 is readily installable in the DUT testing module 300 (FIGS. 4, 5, and 6) because its design is quite flexible to adapt to various requirements and space constraints of the DUT testing module 300 (FIGS. 4, 5, and 6) for different DUT footprints or form factors (e.g., M.2, U.2, SATA 2.5", mSATA, etc.). The size and shape of the right plate 305a, the left plate 305b, the right heat pipe 310a, the left heat pipe 310b, and the heat sink 330 are modifiable to meet or satisfy the conditions and restrictions of the DUT testing.

FIG. 2 shows a right side view of a heat pipe cooling assembly 390 in accordance with an embodiment, showing the heat pipe cooling assembly 390 not installed in a cooling application. The discussion above concerning the heat pipe cooling assembly 390 is equally applicable to FIG. 2.

FIG. 3 illustrates a front elevation view of a heat pipe cooling assembly 390 in accordance with an embodiment, showing the heat pipe cooling assembly 390 not installed in a cooling application. More specifically, an assembly 395 comprising multiple heat pipe cooling assemblies 390 is pictured in FIG. 3. The discussion above concerning the heat pipe cooling assembly 390 and the assembly 395 is equally applicable to FIG. 3.

FIG. 4 depicts a perspective view of an exemplary DUT (device under test) testing module 300 that may utilize a heat pipe cooling assembly (FIGS. 1-3) and also depicts a top portion of another exemplary DUT testing module 300a positioned beneath the exemplary DUT testing module 300 in accordance with an embodiment. An exemplary positioning of multiple exemplary DUT testing modules is shown in FIG. 4. Other arrangements are possible. It should be understood that the heat pipe cooling assembly (FIGS. 1-3) is not installed in the exemplary DUT testing module 300 pictured in FIG. 4 but may be installed therein. The exemplary DUT testing module 300 is modularized and is capable of being inserted into a rack supporting a plurality of modules with communication and power signals carried from the back of the exemplary DUT testing module 300 to one or more central control computers or testing stations (not shown). It should be understood that the exemplary DUT testing module 300 is not limited to the illustration of FIG. 4.

The exemplary DUT testing module 300 includes a DIB (DUT interface board) 200 and a test execution module (or primitive) 100 electrically coupled to the DIB 200. Further, the exemplary DUT testing module 300 is modular and has testing logic for testing the DUTs in the DIB 200. In this capacity, the testing logic supplies high speed communication and power. As described above, the primitive is modular, that is, individual exemplary DUT testing modules 300 may be inserted into respective rack slots to create a rack of customizable columns and rows in an ambient air environment (e.g., a testing floor or lab), eliminating the need for an environmental testing chamber.

The test execution module 100 is operable to perform the testing on a DUT 220 or DUTs 220 by communicating power, instructions, signals, data, test results, and/or information with the DUT 220 or DUTs 220. The test execution module 100 includes processing, communication, and storage circuitry to conduct the test on the DUTs 220. Further, a cooling control loop may be implemented with the test execution module 100 and the DIB 200 to control the cooling of the DUTs 220 by receiving input signals from external temperature sensors in the vicinity of the DUTs 220 and/or input signals from internal temperature sensors inside the DUTs 220 and by adjusting the rotational speeds of the appropriate bottom fan 230a-230d and top fan 240a-240d (FIG. 4 and FIG. 5). Also, the test execution module 100 includes an air conduit 110 to release air flow 291 from the DIB 200 into the surrounding environment.

Continuing with FIG. 4, the DIB 200 is disposed in front of and is electrically coupled to the test execution module 100. The DIB 200 may operate as a DUT receiver to receive and secure the DUTs 220 for testing. The DIB 200 contains a partial enclosure, in that vents on the bottom and top allow air movement therein. Moreover, the DIB 200 includes a cover 201 (or housing), a slot 295, a plurality of sockets 210 to receive and secure the DUTs 220 via the slot 295, and a loadboard 211 (FIG. 5) on which the sockets 210 are securely attached. The sockets 210 are arranged into a row and physically and electrically connect to the DUTs. Also, the loadboard 211 (FIG. 5) electrically and physically interfaces with the test execution module 100 to support communication of power, instructions, signals, data, test results, and/or information between the DUT 220 and the test execution module 100. The loadboard 211 (FIG. 5), on one side that mates with the test execution module 100, has a universal connection layout that matches the test execution module 100 connection layout. On the other side, the loadboard 211 (FIG. 5) comprises sockets 210 that are specific (physically and electrically) to a type of DUT being tested. The DIB 200 addresses the problems caused by the availability of numerous form factors and standards, such as M.2, U.2, SATA 2.5", etc. Instead of the test execution module 100 being designed to accommodate a specific form factor and/or standard, multiple DIBs 200 are designed for each one of the various form factors and/or standards and are removable/replaceable from the test execution module 100.

Further, dual-fan cooling with ambient air is integrated into the DIB 200. The dual-fan cooling with ambient air includes bottom fans 230a-230d inside of the cover 201 of the DIB 200 and top fans 240a-240d inside of and obscured by the cover 201 of the DIB 200. The bottom fan 230c and the top fan 240c are visible in FIG. 5. In an embodiment, each bottom fan 230a-230d is vertically aligned with a respective top fan 240a-240d. Support structure 232 (FIG. 5) securely attaches bottom fans 230a-230d to the DIB 200. Similarly, support structure 242 (FIG. 5) securely attaches top fans 230a-230d to the DIB 200. The rotational speed of the bottom fans and the top fans may be separately adjustable.

Continuing, the DIB 200 includes air guides 250a-250c (FIGS. 4 and 5) and a temperature sensor strip 260 (FIG. 5) with a plurality of external temperature sensors.

Referring again to the dual-fan cooling with ambient air of the DIB 200, the bottom fans 230a-230d are operable to draw ambient air 290 from the surrounding environment via an opening (or vent) positioned below the bottom fans 230a-230d.

The top fan 240a and the bottom fan 230a are operable to generate a vertical ambient air flow 290a from the bottom fan 230a to the top fan 240a to cool the plurality of DUTs 220 within the length and width dimensions of the top and bottom fans 240a and 230a. Also, the top fan 240b and the bottom fan 230b are operable to generate a vertical ambient air flow 290b from the bottom fan 230b to the top fan 240b to cool the plurality of DUTs 220 within the length and width dimensions of the top and bottom fans 240b and 230b. In addition, the top fan 240c and the bottom fan 230c are operable to generate a vertical ambient air flow 290c from the bottom fan 230c to the top fan 240c to cool the plurality of DUTs 220 within the length and width dimensions of the top and bottom fans 240c and 230c. Further, the top fan 240d and the bottom fan 230d are operable to generate a vertical ambient air flow 290d from the bottom fan 230d to the top fan 240d to cool the plurality of DUTs 220 within the length and width dimensions of the top and bottom fans 240d and 230d.

The air guides 250a-250c (FIGS. 4 and 5) are operable to control a direction of the vertical ambient air flow. The air guides 250a-250c (FIGS. 4 and 5) reduce ambient air loss through the slot 295 and assist in directing the vertical ambient air flow towards the top fans 240a-240d.

From the top fans 240a-240d, the air conduit 110 (FIGS. 4 and 5) adjacent to the top fans 240a-240d receives and releases the vertical ambient air flows 291 into the surrounding environment.

In an embodiment, the plurality of DUTs 220 have exposed top and bottom sides and can be arranged on a 13.3 mm pitch, for example. The vertical ambient air flows 290a-290d dissipate heat from the exposed top and bottom sides to cool the plurality of DUTs 220. The exposed top and bottom sides of the plurality of DUTs 220 are vertically aligned with a direction of the vertical ambient air flows 290a-290d to increase the cooling effect of the vertical ambient air flows 290a-290d on the plurality of DUTs 220.

FIG. 5 shows a cutaway view of both the exemplary DUT testing module 300 of FIG. 4 and the top portion of another exemplary DUT testing module 300a positioned beneath the exemplary DUT testing module 300 of FIG. 4 in accordance with an embodiment. An exemplary positioning of multiple exemplary DUT testing modules is shown in FIGS. 4 and 5. Other arrangements are possible. It should be understood that a heat pipe cooling assembly (FIGS. 1-3) is not installed in the exemplary DUT testing module 300 pictured in FIG. 5 but may be installed therein. One fan unit slice (top fan 240c and bottom fan 230c) is depicted in FIG. 5. The other three fan unit slices (top fan 240a and bottom fan 230a, top fan 240b and bottom fan 230b, and top fan 240d and bottom fan 230d) are similar in operation to the fan unit slice (top fan 240c and bottom fan 230c) shown in FIG. 5. It should be understood that the fan unit slice (top fan 240c and bottom fan 230c) of the exemplary DUT testing module 300 is not limited to the illustration of FIG. 5.

The path 280 of ambient air through the bottom fan 230c and top fan 240c of the exemplary DUT testing module 300 (FIG. 4) is illustrated. Initially, the bottom fan 230c draws ambient air from the surrounding environment via the opening (or vent) positioned below the bottom fan 230c. Then, the bottom fan 230c directs the ambient air upward to the top fan 240c while concurrently the top fan 240c also directs the ambient air upwards. Thereafter, the ambient air is released via the air conduit 110 into the surrounding environment.

The vertical ambient air flow 290c (FIG. 4) from the bottom fan 230c and the top fan 240c benefits by the existence of a lower air pressure adjacent to the bottom of the top fan 240c relative to the air pressure down towards the bottom fan 230c. Air naturally flows from areas of higher air pressure to areas of lower air pressure.

In an embodiment, the lower air pressure adjacent to the bottom of the top fan 240c is achieved by operating the top fan 240c at a rotational speed that is greater than a rotational speed of the bottom fan 230c in generating the vertical ambient air flow 290c. This improves the cooling effectiveness of the vertical ambient air flow 290c and helps to prevent the escape of air from the vertical ambient air flow 290c through the slot 295 in the DIB 200 and outward into a face of an operator monitoring a robotic handler for insertion and/or removal of DUTs 220 or manually handling the insertion and/or removal of DUTs 220 from the DIB 200 via the slot 295. In an embodiment, the fan selected to be the top fan 240c has a maximum rotational speed greater than the maximum rotational speed of the fan selected to be the bottom fan 230c. Exemplary values for the maximum rotational speeds are 75 rps (revolutions per second) for the top fan 240c and 60 rps for the bottom fan 230c.

The volume and speed of the vertical ambient air flow 290c due to the top fan 240c and bottom fan 230c are factors in determining the range of temperatures in which the vertical ambient air flow 290c is sufficient to cool the DUTs 220 during testing. The rotational speeds of the top fan 240c and bottom fan 230c may be adjusted in accordance with the amount of cooling that is needed until a set point or desired temperature is reached with respect to the DUTs 220 during testing.

As depicted in FIG. 5, the sizes of top fan 240c and bottom fan 230c are sufficient for the vertical ambient air flow 290c (FIG. 4) to extend across eight DUTs 220 for providing the cooling effect. Exemplary values for the sizes are 92 mm×38 mm for the top fan 240c and 92 mm×25.4 mm for the bottom fan 230c, however, any suitable size can be employed. It is also possible to reduce the number of DUTs 220 to expand the range of temperatures in which the vertical ambient air flow 290c is sufficient to cool the DUTs 220 during testing.

FIG. 6 illustrates a DIB (DUT interface board) 200 of a DUT testing module in accordance with an embodiment, showing a heat pipe cooling assembly 390 (FIGS. 1-3) installed in the DIB 200. The discussion of the heat pipe cooling assembly 390 of FIGS. 1-3 is equally applicable to FIG. 6. The DIB 200 includes a housing 201 and a loadboard 211 that comprises a plurality of sockets 210 (FIGS. 4 and 5) operable to receive and couple to DUTs 220. Also, the DIB 200 is operable to couple to a test execution module (not shown), which is operable to test DUTs 220. Further, the DIB is operable to communicate test information between DUTs 220 and the test execution module (not shown).

As pictured in FIG. 6, the DIB 200 includes each one of a first plurality 601 of DUTs 220 firmly secured between a right plate 305a and a left plate 305b of the heat pipe cooling assembly 390 (FIGS. 1-3) and connected to a respective socket 210 (FIGS. 4 and 5). The right and left plates 305a and 305b are configured in a vertical orientation to contact sides (bottom and top) of the DUTs 220 vertically aligned with the right and left plates 305a and 305b. Further, the right plate 305a and the left plate 305b are coupled to a right heat pipe 310a and a left heat pipe 310b, respectively, of the heat pipe cooling assembly 390 (FIGS. 1-3). Moreover, the right and left heat pipes 310a and 310b extend upward to and are coupled to a heat sink 330, which includes a plurality of fins 335. A fan 240 positioned above the first plurality 601 of DUTs 220 generates an ambient air flow 299 to the heat sink 330, cooling the heat sink 330 and dissipating heat from surfaces of the heat sink 330 and its fins 335. The right and left heat pipes 310a and 310b may also experience a cooling effect from the ambient air flow 299. It should be understood that the DIB 200 with the heat pipe cooling assembly 390 (FIGS. 1-3) installed is not limited to the illustration of FIG. 6.

The DIB 200 also includes each one of a second plurality 602 of DUTs 220 connected to a respective socket 210 (FIGS. 4 and 5), but the second plurality 602 of DUTs 220 are not cooled by the heat pipe cooling assembly 390 (FIGS. 1-3). Instead, the second plurality 602 of DUTs 220 are cooled by an ambient air flow 699 generated by a fan 240 positioned above the second plurality 602 of DUTs 220. Another fan may be positioned below the second plurality 602 of DUTs 220 to assist with generation of the ambient air flow 699 that cools the second plurality 602 of DUTs 220.

The foregoing descriptions of specific embodiments have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the Claims appended hereto and their equivalents.

What is claimed is:

1. A cooling apparatus comprising:
    a first plate operable to contact a first side of a DUT (device under test);
    a second plate operable to contact a second side of the DUT and further disposed opposite and spaced from the first plate to receive the DUT there between;
    a first heat pipe coupled to the first plate and a second heat pipe coupled to the second plate; and
    a heat sink disposed a length from the first and second plates and further coupled to at least one of the first or second heat pipes and further including a plurality of fins.

2. The cooling apparatus of claim 1, further comprising:
    a fan operable to generate an ambient air flow to the heat sink.

3. The cooling apparatus of claim 1, wherein the second plate is movably coupled to the first plate, and wherein the first and second plates are operable in a clamp position to secure the DUT between the first and second plates and are operable in a release position to permit movement of the DUT between the first and second plates.

4. The cooling apparatus of claim 1, wherein the first plate comprises a thickness dimension and a heat sink material, wherein the first heat pipe comprises an evaporation region, and wherein at least a portion of the evaporation region is disposed within the thickness dimension.

5. The cooling apparatus of claim 1, wherein the second plate comprises a thickness dimension and a heat sink material, wherein the second heat pipe comprises an evaporation region, and wherein at least a portion of the evaporation region is disposed within the thickness dimension.

6. The cooling apparatus of claim 1, wherein the first heat pipe comprises a first condensation region in contact with the heat sink, and wherein the second heat pipe comprises a second condensation region in contact with the heat sink.

7. The cooling apparatus of claim 1, wherein the first and second plates are disposed adjacent to a socket operable to receive and couple to the DUT.

8. A cooling apparatus comprising:
    a first plate operable to contact a first side of a DUT (device under test);
    a second plate operable to contact a second side of the DUT and further disposed opposite and spaced from the first plate to receive the DUT there between;
    a first heat pipe including a first evaporation region disposed in the first plate and a first condensation region separated by a first length from the first evaporation region;
    a second heat pipe including a second evaporation region disposed in the second plate and a second condensation region separated by a second length from the second evaporation region; and
    a heat sink coupled to at least one of the first or second condensation regions and further including a plurality of fins.

9. The cooling apparatus of claim 8, further comprising:
    a fan operable to generate an ambient air flow to the heat sink.

10. The cooling apparatus of claim 8, wherein the second plate is movably coupled to the first plate, and wherein the first and second plates are operable in a clamp position to secure the DUT between the first and second plates and are operable in a release position to permit movement of the DUT between the first and second plates.

11. The cooling apparatus of claim 8, wherein the first plate comprises a thickness dimension and a heat sink material, and wherein at least a portion of the first evaporation region is located within the thickness dimension.

12. The cooling apparatus of claim 8, wherein the second plate comprises a thickness dimension and a heat sink material, and wherein at least a portion of the second evaporation region is located within the thickness dimension.

13. The cooling apparatus of claim 8, wherein the first and second plates are disposed adjacent to a socket operable to receive and couple to the DUT.

14. A testing apparatus comprising:
    a test execution module operable to test a DUT (device under test); and
    a DUT interface board (DIB) operable to communicate test information between the DUT and the test execution module, wherein the DIB comprises:
        a housing and a loadboard including a socket operable to receive and couple to the DUT;
        a first plate operable to contact a first side of the DUT;
        a second plate operable to contact a second side of the DUT and further disposed opposite and spaced from the first plate to receive the DUT there between, wherein the socket is disposed adjacent to the first and second plates;
        a first heat pipe coupled to the first plate and a second heat pipe coupled to the second plate; and
        a heat sink disposed a length from the first and second plates and further coupled to at least one of the first or second heat pipes and further including a plurality of fins.

15. The testing apparatus of claim 14, wherein the DIB further comprises:
    a fan operable to generate an ambient air flow to the heat sink.

16. The testing apparatus of claim 14, wherein the second plate is movably coupled to the first plate, and wherein the first and second plates are operable in a clamp position to secure the DUT between the first and second plates and are operable in a release position to permit movement of the DUT between the first and second plates.

17. The testing apparatus of claim 14, wherein the first plate comprises a thickness dimension and a heat sink material, wherein the first heat pipe comprises an evaporation region, and wherein at least a portion of the evaporation region is disposed within the thickness dimension.

18. The testing apparatus of claim 14, wherein the second plate comprises a thickness dimension and a heat sink material, wherein the second heat pipe comprises an evaporation region, and wherein at least a portion of the evaporation region is disposed within the thickness dimension.

19. The testing apparatus of claim 14, wherein the first heat pipe comprises a condensation region in contact with the heat sink.

20. The testing apparatus of claim 14, wherein the second heat pipe comprises a condensation region in contact with the heat sink.

\* \* \* \* \*